(12) United States Patent
Chen et al.

(10) Patent No.: US 11,698,229 B2
(45) Date of Patent: Jul. 11, 2023

(54) THREE-DIMENSIONAL HEAT DISSIPATING DEVICE

(71) Applicant: Auras Technology Co., Ltd., New Taipei (TW)

(72) Inventors: Chih-Wei Chen, New Taipei (TW); Tien-Yao Chang, New Taipei (TW); Che-Wei Kuo, New Taipei (TW); Hsiang-Chih Chuang, New Taipei (TW); Jyun-Wei Huang, New Taipei (TW); Cheng-Ju Chang, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 3 days.

(21) Appl. No.: 17/368,068

(22) Filed: Jul. 6, 2021

(65) Prior Publication Data
US 2022/0018608 A1   Jan. 20, 2022

Related U.S. Application Data

(60) Provisional application No. 63/053,953, filed on Jul. 20, 2020.

(51) Int. Cl.
*F28D 15/04*   (2006.01)
*H05K 7/20*   (2006.01)
(Continued)

(52) U.S. Cl.
CPC ....... *F28D 15/046* (2013.01); *F28D 15/0233* (2013.01); *F28D 15/0275* (2013.01); *F28D 15/0283* (2013.01); *F28D 15/04* (2013.01); *F28F 1/12* (2013.01); *F28F 1/32* (2013.01); *H05K 7/2039* (2013.01);
(Continued)

(58) Field of Classification Search
CPC ............... F28D 15/046; F28D 15/0233; F28D 15/0275; F28D 15/0283; F28D 15/04; F28F 1/12; F28F 1/32; F28F 2215/04; F28F 2215/08; F28F 2230/00; H05K 7/2039

See application file for complete search history.

(56) References Cited

U.S. PATENT DOCUMENTS 6,738,257 B1 * 5/2004 Lai ............................ F28F 1/32
                                                                174/15.2
7,540,318 B2 * 6/2009 Nitta ..................... H01L 23/427
                                                                257/715
(Continued)

*Primary Examiner* — Tho V Duong
(74) *Attorney, Agent, or Firm* — Muncy, Geissler, Olds & Lowe, P.C.

(57) ABSTRACT

A three-dimensional heat dissipating device includes a vapor chamber, a heat pipe, a working fluid and a solder bonding portion. The vapor chamber includes an inner cavity and a first joint. The first joint is formed with a passage being in communication with the inner cavity. The heat pipe is provided with a pipe space and a second joint. The pipe space is in communication with the inner cavity through the passage. The second joint is sleeved to surround the first joint such that one end surface of the second joint is directly contacted with one surface of the vapor chamber. The working fluid is filled within the pipe space and the inner cavity. The solder bonding portion connected to the second joint and the surface of the vapor chamber for integrating the heat pipe and the vapor chamber together.

15 Claims, 11 Drawing Sheets

(51) Int. Cl.
  *F28D 15/02* (2006.01)
  *F28F 1/32* (2006.01)
  *F28F 1/12* (2006.01)
(52) U.S. Cl.
  CPC ....... *F28F 2215/04* (2013.01); *F28F 2215/08* (2013.01); *F28F 2230/00* (2013.01)

(56) References Cited

U.S. PATENT DOCUMENTS

| | | | | |
|---|---|---|---|---|
| 8,246,902 | B2* | 8/2012 | Hou | B22F 3/225 |
| | | | | 419/36 |
| 10,077,946 | B2* | 9/2018 | Sun | B23K 1/18 |
| 10,371,457 | B2* | 8/2019 | Chen | F28D 15/0275 |
| 10,598,441 | B2* | 3/2020 | Kawabata | H01L 23/427 |
| 2017/0153066 | A1* | 6/2017 | Lin | F28D 15/046 |
| 2017/0312871 | A1* | 11/2017 | Lin | B23P 15/26 |
| 2017/0314873 | A1* | 11/2017 | Lin | B23P 15/26 |

* cited by examiner

THREE-DIMENSIONAL HEAT DISSIPATING DEVICE

RELATED APPLICATIONS

This application claims priority to U.S. Application Ser. No. 63/053,953, filed Jul. 20, 2020, which is herein incorporated by reference.

BACKGROUND

Field of Disclosure

The disclosure relates to a heat dissipating device. More particularly, the disclosure relates to a three-dimensional heat dissipating device.

Description of Related Art

In present, a heat dissipating structure includes a vapor chamber and a heat pipe, and is provided with characteristics of thermal conduction, light weight and simple structure. Accordingly, the heat dissipating structure has been widely applied in the field of high-performance heat dissipation. For example, the vapor chamber and the heat pipe of the heat-conducting structure are bonded to each other through a soldering process.

However, solder materials might be easily overflowed to penetrate into the heat pipe during the soldering process. Thereby, not only affecting the bonding effect of welding, but also affecting the product yield, so as to reduce the work efficiency of the heat dissipating structure.

Given above, how to develop a solution for effectively overcoming the aforementioned inconvenience and shortages is a serious concern for many industries.

SUMMARY

In one embodiment of the disclosure, a three-dimensional heat dissipating device is provided for solving the problems mentioned in the prior art.

In one embodiment of the disclosure, the three-dimensional heat dissipating device includes a vapor chamber, a working fluid, at least one heat pipe and at least one solder bonding portion. The vapor chamber includes an inner cavity and at least one first joint. The first joint is formed with a passage that is in communication with the inner cavity. The heat pipe is provided with a pipe space and at least one second joint. The pipe space is in communication with the inner cavity through the passage. The second joint is sleeved to surround the first joint such that one end surface of the second joint is directly contacted with one surface of the vapor chamber. The working fluid is filled within the pipe space and the inner cavity. The solder bonding portion is connected to the second joint and the surface of the vapor chamber for integrating the heat pipe and the vapor chamber together.

According to one or more embodiments of the disclosure, in the three-dimensional heat dissipating device, the second joint is connected to and surrounds one end of the heat pipe, and the second joint gradually expands outwardly from the end of the heat pipe radially in a direction facing away from the heat pipe and the first joint such that the second joint surrounds to form a cone-shaped space. A maximum diameter of the cone-shaped space is greater than a maximum diameter of the pipe space.

According to one or more embodiments of the disclosure, in the three-dimensional heat dissipating device, the vapor chamber includes a cover body and a case body which are sealed to each other so as to form the inner cavity between the cover body and the case body. The first joint is formed on a top surface of the cover body.

According to one or more embodiments of the disclosure, in the three-dimensional heat dissipating device, the solder bonding portion surrounds a periphery of the first joint, and the solder bonding portion is closely filled within a slit defined among the first joint, the second joint and the vapor chamber.

According to one or more embodiments of the disclosure, the three-dimensional heat dissipating device further includes a first capillary structure and a second capillary structure. The first capillary structure is directly located within the inner cavity for guiding a flow of the working fluid. The second capillary structure includes a first section and at least one second section. The first section is fixedly disposed within the inner cavity, and connected to the second section, and the second section curvedly extends outwards from one end of the first section, disposed within the inner cavity, and connected to the first capillary structure for guiding the flow of the working fluid.

According to one or more embodiments of the disclosure, in the three-dimensional heat dissipating device, the first capillary structure includes a first plate. The first plate is directly formed on one surface of the case body facing towards the cover body, and directly sandwiched between the case body and the second section of the second capillary structure.

According to one or more embodiments of the disclosure, in the three-dimensional heat dissipating device, the first capillary structure includes a second plate. The second plate is directly formed on one surface of the cover body facing towards the case body. One part of the first section of the second capillary structure is located within the inner cavity, and in contact with the first plate or the second plate of the first capillary structure.

According to one or more embodiments of the disclosure, the three-dimensional heat dissipating device further includes a fin assembly. The fin assembly includes a plurality of heat-dissipation fins. The heat-dissipation fins are spaced arranged abreast and parallel to one another, and penetrated by the heat pipe simultaneously.

According to one or more embodiments of the disclosure, in the three-dimensional heat dissipating device, the heat pipe is in one of a linear shape, an L-type and a U-type.

According to one or more embodiments of the disclosure, the three-dimensional heat dissipating device further includes two first fin assemblies and a second fin assembly. The first fin assemblies are spaced arranged on the vapor chamber. Each of the first fin assemblies includes a plurality of first heat-dissipation fins. The heat pipe is plural in number, and each of the heat pipes is provided with a long axis direction that is perpendicularly passed through a top surface of the vapor chamber. The first heat-dissipation fins are spaced arranged abreast along the long axis direction. The heat pipes include at least one first heat pipe and at least one second heat pipe, the first heat-dissipation fins of one of the first fin assemblies are vertically penetrated through by the first heat pipe simultaneously, and the first heat-dissipation fins of the other of the first fin assemblies are vertically penetrated through by the second heat pipe simultaneously. The second fin assembly includes a trapezoidal body between the first fin assemblies, and the trapezoidal body includes a plurality of second heat-dissipation fins. The second heat-dissipation fins are spaced arranged abreast on the vapor chamber along a traversal direction orthogonal to the long axis direction. The trapezoidal body includes a top portion, a bottom portion, and two inclined portions that are opposite to each other. The bottom portion is opposite to the top portion and fixedly connected to the vapor chamber. The top portion is located between the inclined portions. A void gap is formed between each of the two inclined portions and one adjacent of the first fin assemblies.

According to one or more embodiments of the disclosure, in the three-dimensional heat dissipating device, a first gap is formed between any two adjacent ones of the first heat-dissipation fins, and a second gap is formed between the vapor chamber and one of the first heat-dissipation fins being adjacent to the vapor chamber. The second gap is greater than the first gap.

According to one or more embodiments of the disclosure, in the three-dimensional heat dissipating device, the first joint is two in number, the heat pipe is one in number, and the second joint is two in number, and the second section of the second capillary structure is two in number. The second joints are located at two opposite ends of the heat pipe. Each of the second joints of the heat pipe is sleeved to surround the corresponding one of the first joints. The second section are connected to two opposite ends of the first section, respectively. The second sections are respectively connected to the first capillary structure in the inner cavity.

According to one or more embodiments of the disclosure, the three-dimensional heat dissipating device further includes a third fin assembly. The third fin assembly includes a top portion and a bottom portion being opposite to each other, the bottom portion is connected to the top surface of the vapor chamber. The third fin assembly includes a plurality of third heat-dissipation fins. The third heat-dissipation fins are spaced arranged abreast along a longitudinal direction orthogonal to a normal direction of the top surface of the vapor chamber. The heat pipe is in a U type, and one part of the heat pipe is disposed on the top portion of the third fin assembly, and the other part of the heat pipe extends into the third heat-dissipation fins from the top portion of the third fin assembly.

According to one or more embodiments of the disclosure, the three-dimensional heat dissipating device further includes a third fin assembly and a fourth fin assembly. The third fin assembly is disposed on the vapor chamber, and the third fin assembly includes a plurality of third heat-dissipation fins spaced arranged abreast along a longitudinal direction orthogonal to a normal direction of the top surface of the vapor chamber. The fourth fin assembly is stacked on the third fin assembly, and the fourth fin assembly includes a plurality of fourth heat-dissipation fins spaced arranged abreast along the longitudinal direction. The heat pipe is in a U type, and disposed within the third fin assembly and the fourth fin assembly.

According to one or more embodiments of the disclosure, the three-dimensional heat dissipating device further includes a third fin assembly. The third fin assembly includes a top portion and a bottom portion being opposite to each other. The bottom portion is connected to the top surface of the vapor chamber. The third fin assembly includes a plurality of third heat-dissipation fins. The third heat-dissipation fins are spaced arranged abreast along a longitudinal direction orthogonal to a normal direction of the top surface of the vapor chamber. The heat pipe is in an L type, and one part of the heat pipe is disposed on the top portion of the third fin assembly, and the other part of the heat pipe extends into the third heat-dissipation fins from the top portion of the third fin assembly.

According to one or more embodiments of the disclosure, the three-dimensional heat dissipating device further includes a third fin assembly and a fourth fin assembly. The third fin assembly is disposed on the vapor chamber, includes a plurality of third heat-dissipation fins spaced arranged abreast along a longitudinal direction orthogonal to a normal direction of the top surface of the vapor chamber. The fourth fin assembly is stacked on the third fin assembly, and includes a plurality of fourth heat-dissipation fins spaced arranged abreast along the longitudinal direction. The heat pipe is in an L type, and disposed within the third fin assembly and the fourth fin assembly.

With the structure described in the above embodiments, the disclosure is allowed to prevent the solder material from overflowing and penetrating into the vapor chamber and the heat pipe during the soldering process. Thus, not only the bonding effect of soldering is improved, but also the product yield rate and the working efficiency of the heat dissipating structure are improved.

The above description is merely used for illustrating the problems to be resolved, the technical methods for resolving the problems and their efficacies, etc. The specific details of the disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
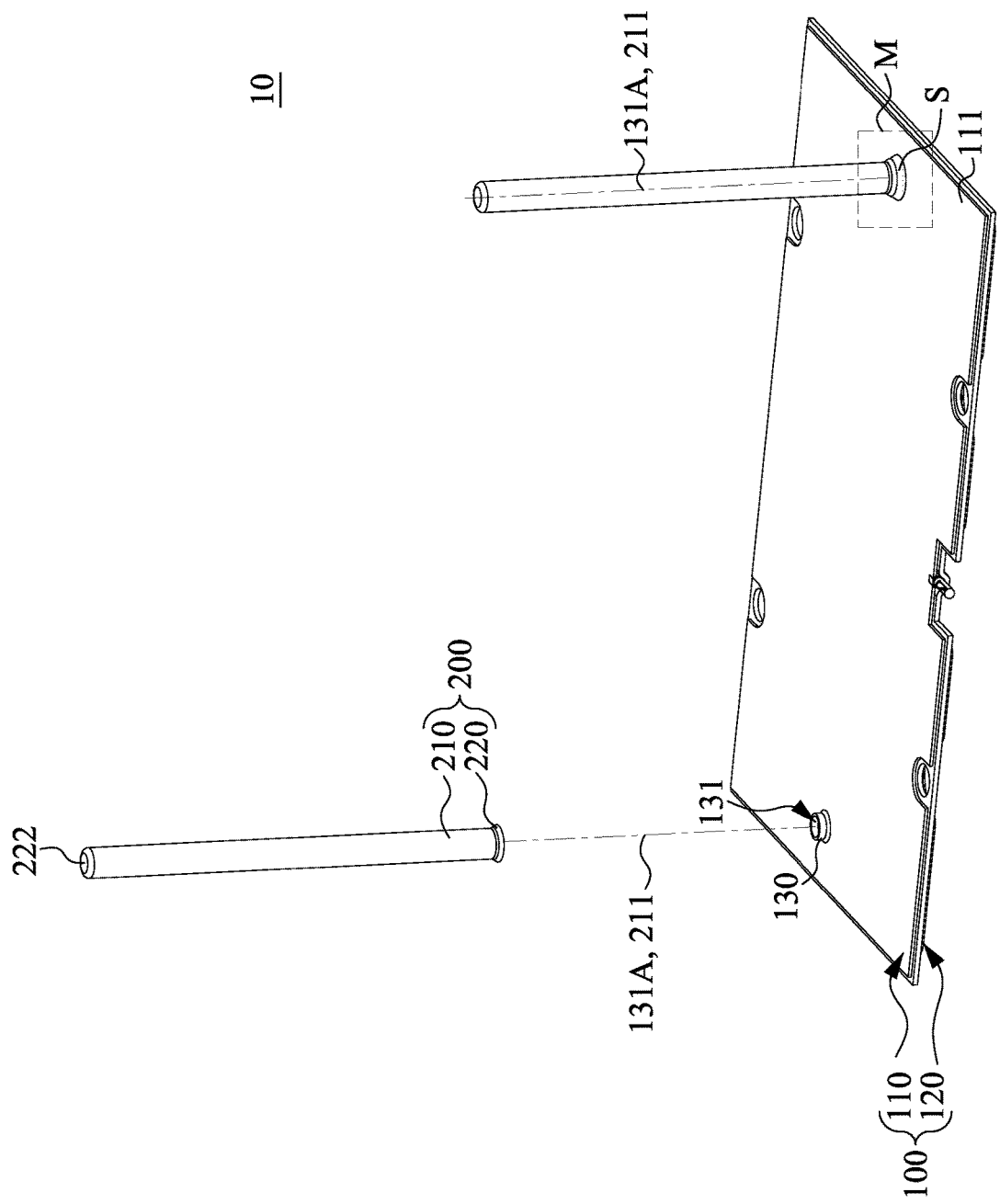
FIG. 1 is a partially exploded view of a three-dimensional heat dissipating device according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the disclosure without departing from the scope or spirit of the disclosure.

Figure 2:
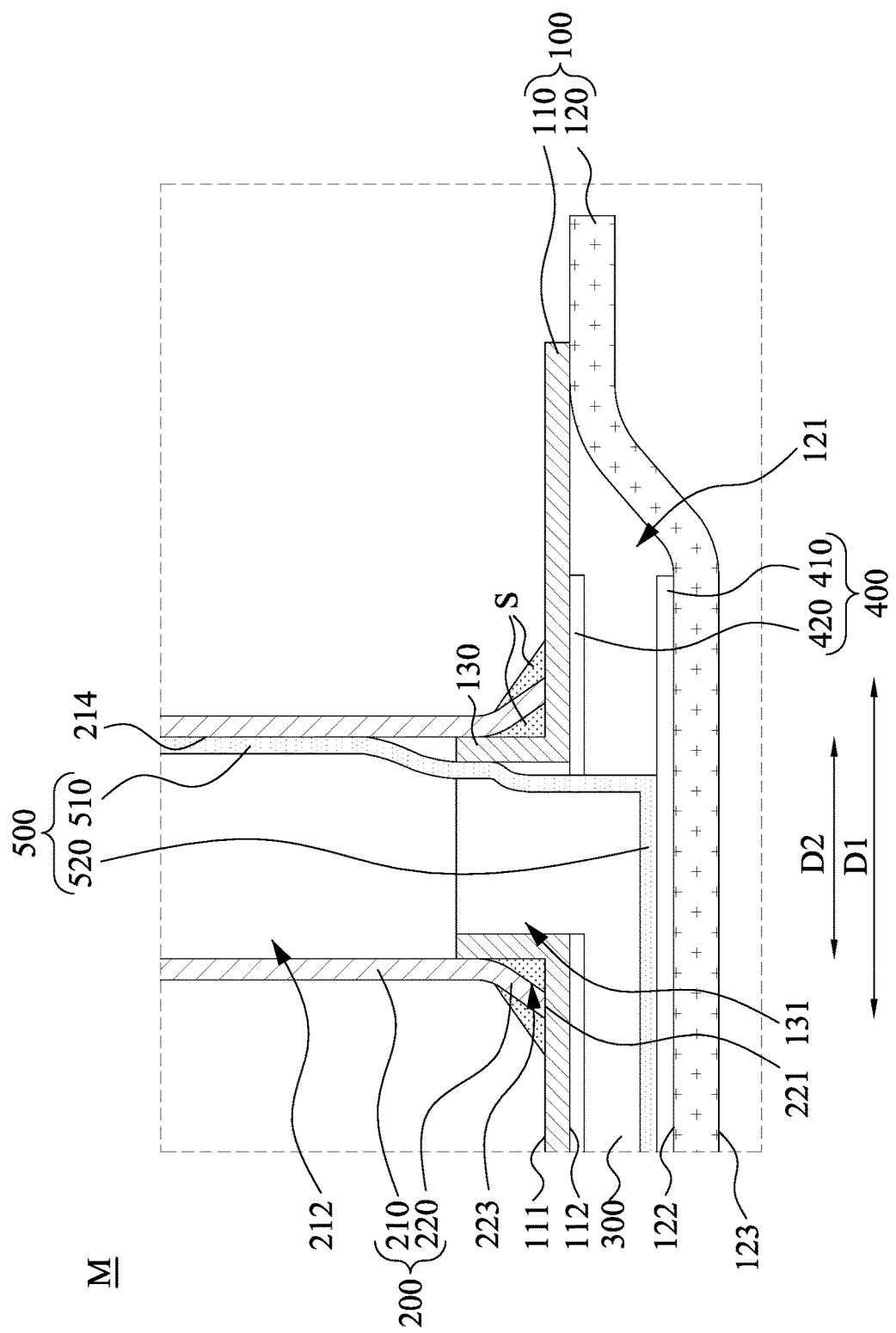
FIG. 2 is a partial cross section view of an area M of the three-dimensional heat dissipating device of FIG. 1.

Reference is now made to FIG. 1 to FIG. 2, in which FIG. 1 is a partially exploded view of a three-dimensional heat dissipating device 10 according to one embodiment of the disclosure, and FIG. 2 is a partial cross section view of an area M of the three-dimensional heat dissipating device 10 of FIG. 1. As shown in FIG. 1 and FIG. 2, the three-dimensional heat dissipating device 10 includes a vapor chamber 100 and a plurality of (e.g., two) heat pipes 200. The vapor chamber 100 includes a cover body 110 and a case body 120 which are sealed to each other so as to form the inner cavity 121 between the cover body 110 and the case body 120. One surface (referred to as top surface 111 hereinafter) of the cover body 110 facing away from the case body 120 is provided with a plurality of (e.g., two) first joints 130. The first joints 130 are spaced arranged on the top surface 111 of the cover body 110. Each of the first joints 130 extends outwardly from the top surface 111 of the cover body 110, and each of the first joints 130 is formed with a passage 131 that is in communication with the inner cavity 121. Each of the passages 131 of the first joints 130 is provided with a long axis direction 131A, and the long axis directions 131A of the passages 131 are parallel to one another. The case body 120 is provided with an inner surface 122 and an bottom surface 123 which are opposite to each other.

Each of the heat pipes 200 is provided with a pipe body 210 and one second joint 220. In the embodiment, each of the pipe body 210 is in a linear shape, and a long axis direction 211 of the pipe body 210 is coaxially aligned with the long axis direction 131A of each of the passage 131, and the long axis direction 211 (i.e., normal direction of the top surface) of the pipe body 210 is perpendicular to the top surface 111 of the cover body 110. One end of the pipe body 210 is an enclosed end 222, and the other end of the pipe body 210 is connected to the second joint 220. The pipe body 210 is formed with a pipe space 212 extending along the long axis direction 131A of the passage 131. In the embodiment, the second joint 220 is connected to surround the other end of the pipe body 210, and gradually expands outwardly from the other end of the pipe body 210 radially in a direction facing away from the pipe body 210 and the first joint 130 such that the second joint 220 surrounds to form a cone-shaped space 223. A maximum diameter (referred to D1) of the cone-shaped space 223 is greater than a maximum diameter (referred to D2) of the pipe space 212.

When one of the heat pipes 200 is connected to the vapor chamber 100, one of the second joints 220 of the heat pipes 200 is sleeved to surround one of the first joints 130 of the vapor chamber 100, each of the second joints 220 is connected to the cover body 110, and the pipe space 212 inside the pipe body 210 is in communication with the inner cavity 121 of the vapor chamber 100 through the passage 131 mentioned above. Next, the three-dimensional heat dissipating device 10 further fixedly integrates the heat pipe 200 and the vapor chamber 100 together through soldering material so that the soldering material can be formed into a solder bonding portion S to be located at the second joint 220 and the top surface 111 of the cover body 110, and within a slit (referring to the cone-shaped space 223) defined among the first joint 130, the second joint 220 and the top surface 111 of the cover body 110. Accordingly, the heat pipe 200 and the vapor chamber 100 are fixedly integrated together so as to allow a working fluid 300 being filled within the pipe space 212 and the inner cavity 121. In other words, a part of the solder bonding portion S surrounds a periphery of the first joint 130 and is located on the top surface 111 of the cover body 110, and the other part of the solder bonding portion S is closely filled within the slit (referring to the cone-shaped space 223) defined among the first joint 130, the second joint 220 and the vapor chamber 100.

More specifically, when the second joint 220 of the heat pipe 200 is connected to the first joint 130 of the vapor chamber 100, since a maximum inner diameter D1 of the second joint 220 is greater than a maximum inner diameter D2 of the pipe body 210, the first joint 130 is able to extend into the second joint 220 and one part of the pipe body 210, and the end surface 221 of the second joint 220 is directly contacted with the top surface 111 of the cover body 110 so as to possibly minimize the slit formed between the second joint 220 and the cover body 110. At this moment, the solder bonding portion S surrounds a periphery edge of the second joint 220 to seal the slit (referring to the cone-shaped space 223) that is defined among the first joint 130, the second joint 220 and the top surface 111 of the cover body 110.

Furthermore, the three-dimensional heat dissipating device 10 further includes a first capillary structure 400 and a second capillary structure 500. The first capillary structure 400 is located within the inner cavity 121. The second capillary structure 500 is located within the pipe space 212 and the inner cavity 121 for guiding a flow of the working fluid 300. Thus, when the vapor chamber 100 absorbs the working thermal energy of a heat source (not shown in figures) to heat and vaporize the working fluid 300, the vaporized working fluid 300 flows to the pipe space 212 through the passage 131 and flows towards one end of the heat pipe 200 facing away from the heat source (not shown in figures) so as to be condensed back into a liquid state. Finally, the liquid working fluid 300 can be guided by the first capillary structure 400 and the second capillary structure 500 to be flowed back into the evaporation area where the working fluid 300 used to be vaporized. Thus, the working fluid 300 that is away from the heat source can be sent back for achieving the purpose of heat dissipation.

With the structure described in the above embodiment, the three-dimensional heat dissipating device 10 is allowed to prevent the solder material from overflowing and penetrating into the vapor chamber 100 and the heat pipe 200 during the soldering process. Thus, not only the bonding effect of soldering is improved, but also the product yield rate and the working efficiency of the heat dissipating structure are improved.

More specifically, the first capillary structure 400 includes a first plate 410 and a second plate 420. The first plate 410 and the second plate 420 are respectively disposed at two opposite sides of the inner cavity 121, and remained a distance from each other. For example, the first plate 410 is directly formed on the inner surface 122 of the case body 120, and the inner surface 122 of the case body 120 is fully covered with the first plate 410; in other words, an outer contour of the first plate 410 and an outer contour of the inner surface 122 of the case body 120 are substantially the same or at least similar to each other. The second plate 420 is directly formed on a back surface 112 of the cover body 110, and the back surface 112 of the cover body 110 is fully covered with the second plate 420; in other words, an outer contour of the second plate 420 and an outer contour of the back surface 112 of the cover body 110 are substantially the same as or at least similar to each other.

The second capillary structure 500 is in a L-shape, and the second capillary structure 500 includes a first section 510 and a second section 520. The first section 510 is disposed within the pipe space 212, and connected to the second section 520. Each of the first section 510 and the second section 520 is a linear strip, respectively. The second section 520 curvedly extends outwards from one end of the first section 510, disposed within the inner cavity 121, and fixedly connected to the first capillary structure 400. For example, the second section 520 and the first section 510 are orthogonal to each other, or at least nearly orthogonal. The first section 510 of the second capillary structure 500 is not fixedly disposed on an inner wall 214 of the pipe space 212, and may be hung down within the pipe space 212, or may be non-fixedly attached to the inner wall 214 of the pipe space 212. One part of the first section 510 of the second capillary structure 500 is located within the inner cavity 121, and in contact with the second plate 420 of the first capillary structure 400. The second section 520 of the second capillary structure 500 directly covers the first plate 410 of the first capillary structure 400, and the first plate 410 of the first capillary structure 400 is directly sandwiched between the inner surface 122 of the case body 120 and the second section 520 of the second capillary structure 500. Thus, one part of the working fluid 300 being away from the heat source can flow to the first capillary structure 400 from the first section 510 of the second capillary structure 500, and the other part of the working fluid 300 being away from the heat source can flow to the first capillary structure 400 from the second section 520 of the second capillary structure 500 so as to be flowed back into the aforementioned evaporation area in the vapor chamber 100, respectively.

In one embodiment, when the second section 520 of the second capillary structure 500 is plural in number, the plural second sections 520 are respectively curvedly extended outwards from one end of the first section 510, disposed within the inner cavity 121, and fixedly connected to the first capillary structures 400 which are located at different regions, however, the disclosure is not limited thereto.

Through the design of the plural second sections 520, temperature equalization effect of the vapor chamber 100 can be increased to improve the heat dissipation effect. In this way, when the heat sources (not shown in figures) are plural in number, and arranged at the bottom surface 123 of the case body 120 at intervals, the second sections 520 can be respectively positioned above the heat sources exactly so as to quickly receive working thermal energy from these heat sources (not shown in figures).

Figure 3:
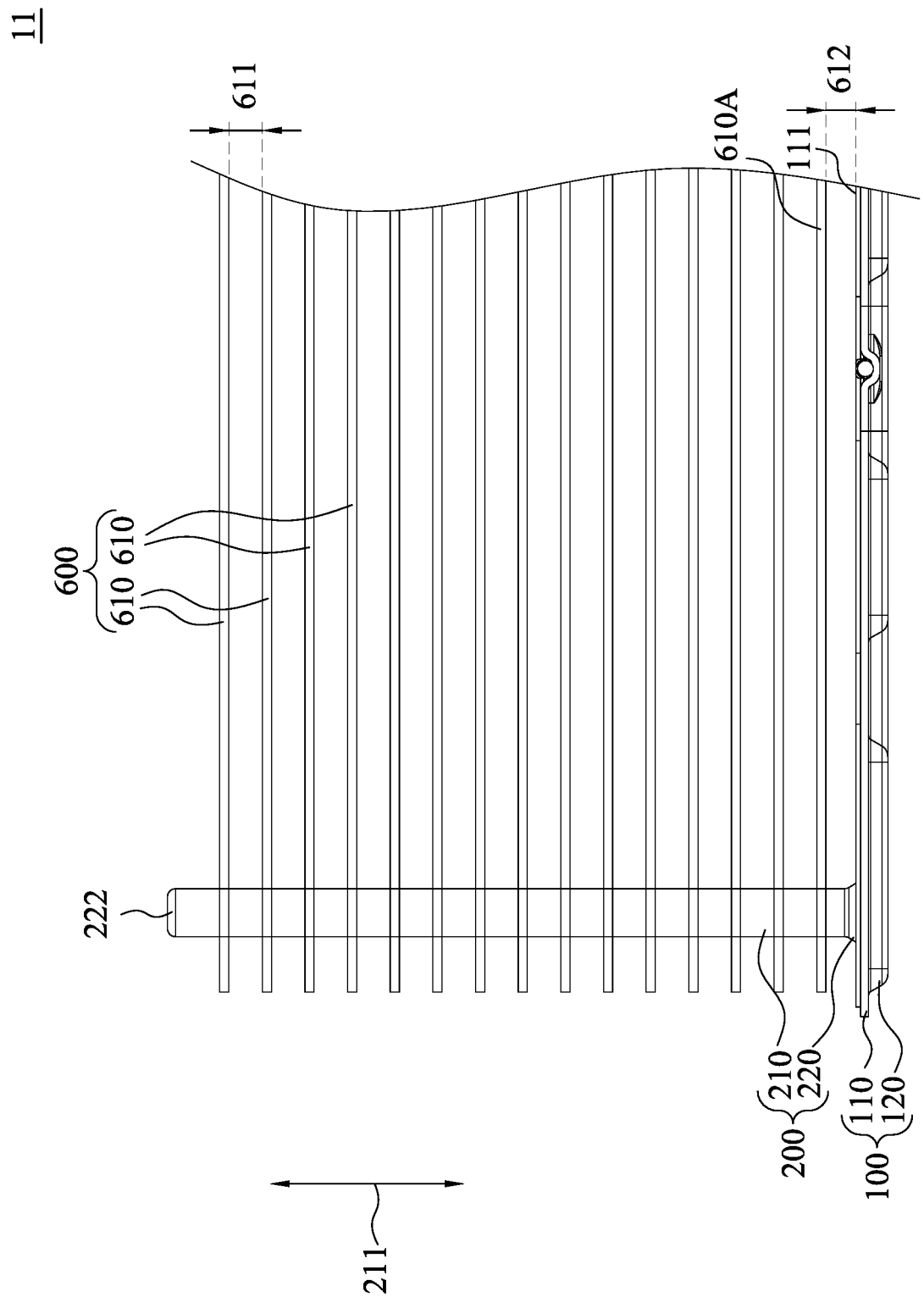
FIG. 3 is a partial side view of a three-dimensional heat dissipating device according to one embodiment of the disclosure.

FIG. 3 is a partial side view of a three-dimensional heat dissipating device 11 according to one embodiment of the disclosure. As shown in FIG. 3, the three-dimensional heat dissipating device 11 of the embodiment is substantially the same to the three-dimensional heat dissipating device 10 of FIG. 1, and at least one of differences between the three-dimensional heat dissipating device 11 and the three-dimensional heat dissipating device 10 is that the three-dimensional heat dissipating device 11 further includes a fin assembly 600. The fin assembly 600 includes a plurality of heat-dissipation fins 610. The heat-dissipation fins 610 are penetrated by the heat pipes 200 simultaneously, and are spaced arranged abreast and parallel to one another. More specifically, the first heat-dissipation fins 610 are arranged abreast on the heat pipe 200 at equal distances along the long axis direction 211 of the pipe body 210. A first gap 611 is formed between any two adjacent ones of the first heat-dissipation fins 610, and a second gap 612 is formed from the top surface 111 of the cover body 110 to the most bottom of the first heat-dissipation fins 610 (i.e., the first heat-dissipation fin 610A closest to the vapor chamber 100). Any two of the first gaps 611 between the first heat-dissipation fins 610 are substantially the same, and the second gap 612 is substantially the same as the first gap 611.

Thus, after the working thermal energy is transferred to the heat pipes 200, the working thermal energy can be quickly transferred to the first heat-dissipation fins 610 from the heat pipes 200, and then dissipated into the atmosphere through the first heat-dissipation fins 610.

Figure 4:
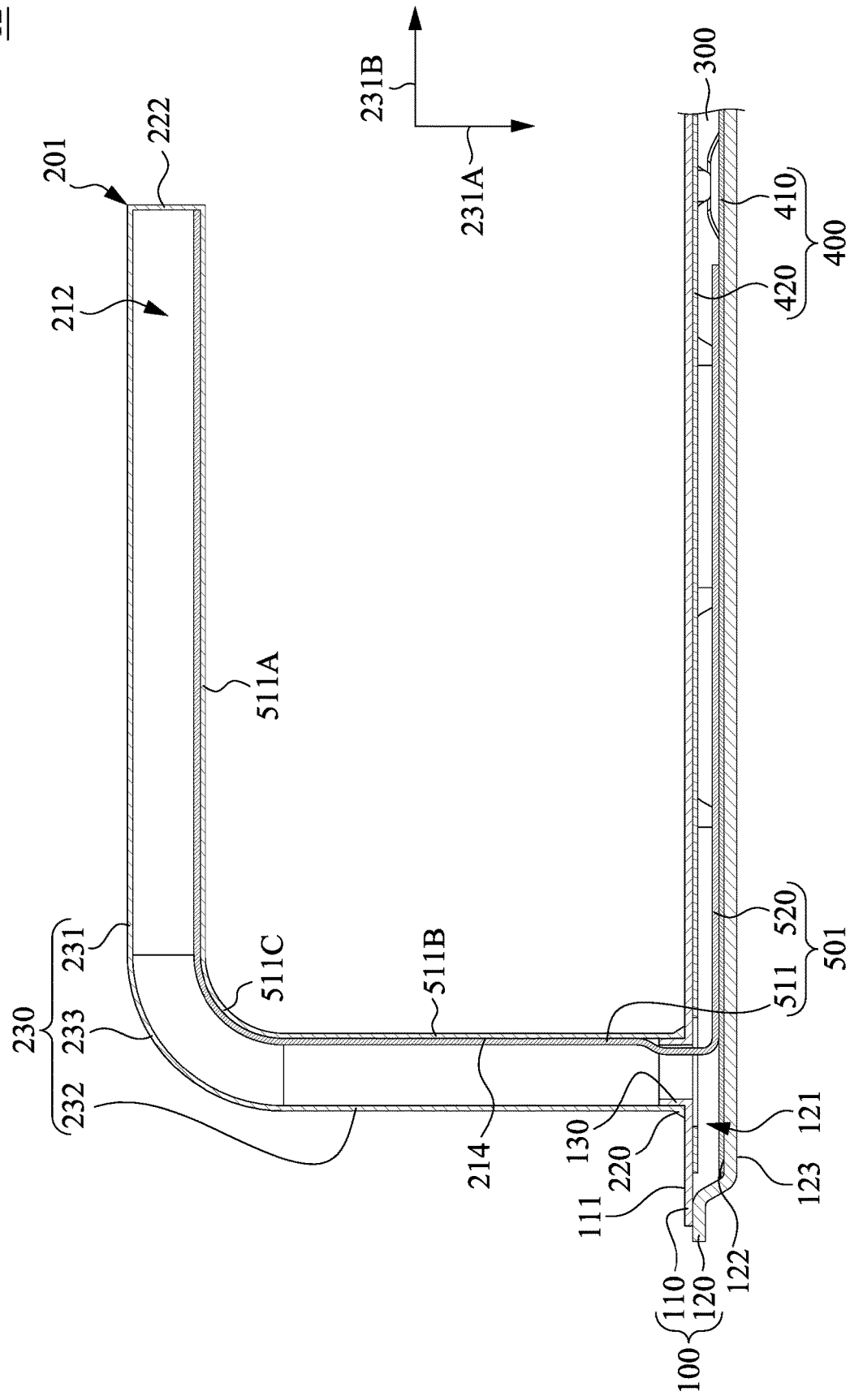
FIG. 4 is a perspective view of a three-dimensional heat dissipating device according to one embodiment of the disclosure.

FIG. 4 is a perspective view of a three-dimensional heat dissipating device 12 according to one embodiment of the disclosure. As shown in FIG. 4, the three-dimensional heat dissipating device 12 of the embodiment is substantially the same to the three-dimensional heat dissipating device 10 of FIG. 1, and at least one of differences between the three-dimensional heat dissipating device 12 and the three-dimensional heat dissipating device 10 is that the pipe body 230 of each of the heat pipes 201 is in a L-shape rather than a linear shape. The first section 511 of the second capillary structure 501 is in a L-shape rather than a linear shape. More specifically, the pipe body 230 includes a first segment 231, a second segment 232, and a bending portion 233. The bending portion 233 is connected to the first segment 231 and the second segment 232 so that a long axis direction 231A of the first segment 231 is perpendicular to a long axis direction 232A of the second segment 232, and the long axis direction 232A of the second segment 232 is perpendicularly passed through the top surface 111 of the cover body 110, wherein the enclosed end 222 of the pipe body 230 is located on the first segment 231, and the second joint 220 is located at the second segment 232.

Furthermore, the first section 511 of the second capillary structure 501 is located within the pipe space 212. In the embodiment, the first section 511 of the second capillary structure 501 is not fixedly disposed on the inner wall 214 of the pipe space 212, and possibly hung down within the pipe space 212, or may be non-fixedly attached to the inner wall 214 of the pipe space 212. One end of the first section 511 of the second capillary structure 501 is connected to the enclosed end 222 of the pipe body 230, and the other end extends into the inner cavity 121 from the pipe body 230 via the first segment 231, the bending portion 233 and the second segment 232 sequentially. The second section 520 of the second capillary structure 501 is in a linear shape, and a long axis direction 231B of the second section 520 and a long axis direction 231B of the first segment 231 are parallel to each other, or at least nearly parallel.

In specific, the first section 511 includes a first subsection 511A, a second subsection 511B and a bending section 511C. The first subsection 511A and the second subsection 511B are in a linear shape, respectively, and the bending section 511C in a curved shape is connected to the first subsection 511A and the second subsection 511B. The first subsection 511A is disposed within one part of the pipe space 212 corresponding to the first segment 231, the second subsection 511B is disposed within another part of the pipe space 212 corresponding to the second segment 232, and the bending section 511C is disposed within the other part of the pipe space 212 corresponding to the bending portion 233.

In one embodiment, when the second section 520 of the second capillary structure 501 is plural in number, the plural second sections 520 are respectively curvedly extended outwards from one end (e.g., second subsection 511B) of the first section 511, disposed within the inner cavity 121, and fixedly connected to the first capillary structures 400 (e.g., the first plate 410 or the second plate 420) which are located at different regions, however, the disclosure is not limited thereto. Through the design of the plural second sections 520, temperature equalization effect of the vapor chamber 100 can be increased to improve the heat dissipation effect. In this way, when the heat sources (not shown in figures) are plural in number, and arranged at the bottom surface 123 of the case body 120 at intervals, the second sections 520 can be respectively positioned above the heat sources exactly so as to quickly receive working thermal energy from these heat sources (not shown in figures).

In one embodiment, one surface of the first segment 231 of the heat pipe 230 facing towards the vapor chamber 100 is flat, but the disclosure is not limited thereto.

Figure 5:
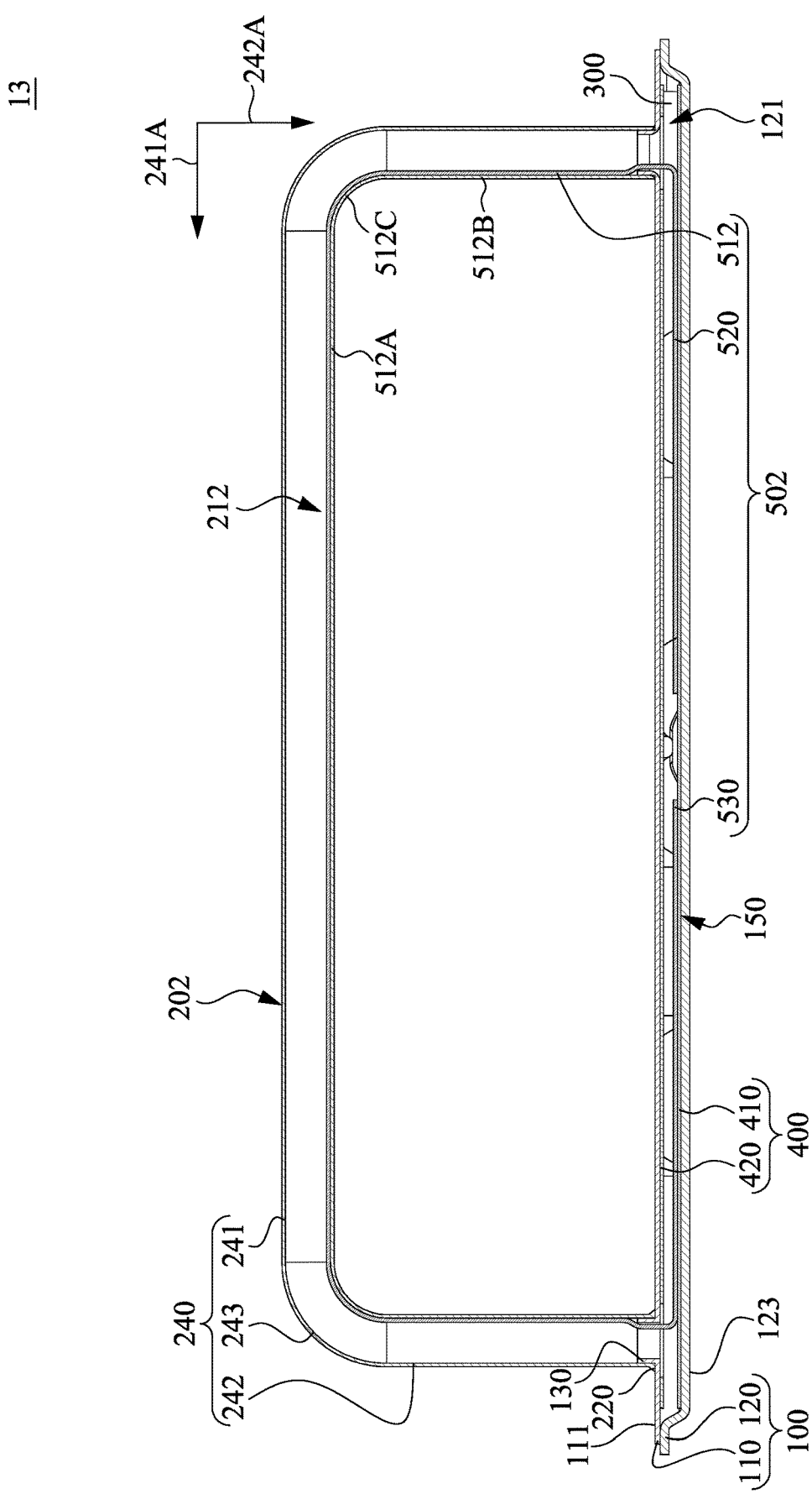
FIG. 5 is a perspective view of a three-dimensional heat dissipating device according to one embodiment of the disclosure.

FIG. 5 is a perspective view of a three-dimensional heat dissipating device 13 according to one embodiment of the disclosure. As shown in FIG. 5, the three-dimensional heat dissipating device 13 of the embodiment is substantially the same to the three-dimensional heat dissipating device 10 of FIG. 1, and at least one of differences between the three-dimensional heat dissipating device 13 and the three-dimensional heat dissipating device 10 is that the heat pipe 202 can be single or plural, and the pipe body 240 of the heat pipe 202 is in a U-shape rather than a linear shape. The second joint 220 is two in number, and the second joints 220 are respectively disposed at two opposite ends of the pipe body 240 for being sleeved with corresponding one of the first joints 130, respectively (refer to FIG. 1). In other words, the heat pipe 202 is provided without an enclosed end. In specific, the pipe body 240 includes a first segment 241, two second segments 242 and two bending portions 243. Each of the bending portions 243 is connected to one end of the first segment 241 and one of the second segments 242 so that a long axis direction 241A of the first segment 241 is perpendicular to a long axis direction 242A of the second segment 242, and the long axis direction 242A of the second segment 242 is perpendicularly passed through the top surface 111 of the cover body 110. Each of the second joints 220 is located at the end of the second segment 242. Thus, refer to FIG. 2, the working fluid 300 can be sent into the pipe space 212 from the inner cavity 121 of the vapor chamber 100 through one of the second joints 220, and sent back to the inner cavity 121 from the pipe space 212 through the other of the second joints 220.

The second capillary structure 502 includes a first section 512, a second section 520 and a third section 530. The first section 512 of the second capillary structure 502 is in a U-shape rather than a linear shape. The second section 520 and the third section 530 of the second capillary structure 502 are respectively disposed at the two opposite ends of the first section 512, and curvedly extended towards the inner cavity 121 so as to fixedly connected to the first capillary structure 400. The first section 512 of the second capillary structure 502 is located within the pipe space 212.

In other words, the heat pipe 202 in the embodiment is provided without an enclosed end. In specific, the pipe body 240 includes a first segment 241, two second segments 242, and two bending portions 243. Each of the bending portions 243 is connected to one end of the first segment 241 and one end of the second segment 242 so that a long axis direction 241A of the first segment 241 and a long axis direction 242A of each of the second segments 242 are perpendicular to, or at least nearly perpendicular to each other. A long axis direction 242A of each of the second segments 242 is perpendicularly passed, or at least nearly perpendicularly passed through the top surface 111 of the cover body 110. Each of the second joints 220 is located at one distal end of each of the second segments 242. The first section 512 of the second capillary structure 502 is arranged into the heat pipe 202 via one of the second segments 242, one of the bending portions 243, the first segment 241, the other of the bending portions 243 and the other of the second segments 242 in order. Thus, the vaporized working fluid 300 can be flowed into the pipe space 212 from the inner cavity 121 of the vapor chamber 100 through one of the second joints 220. When the vaporized working fluid 300 is condensed back into a liquid working fluid 300, the liquid working fluid 300 can be guided by the second capillary structure 502 to the first capillary structure 400, or even back to the aforementioned evaporation area for achieving the heat dissipation function.

In specific, the first section 512 includes a first subsection 512A, two second subsections 512B and two bending sections 512C. The first subsection 512A and one of the second subsections 512B are in a curved shape, respectively, and each of the bending sections 512C is connected to the first subsection 512A and one of the second subsections 512B. The first subsection 512A is disposed within one part of the pipe space 212 corresponding to the first segment 241, each of the second subsections 512B is disposed within another part of the pipe space 212 corresponding to one of the second segments 242, and each of the bending sections 512C is disposed within one another part of the pipe space 212 corresponding to one of the bending portions 243.

In one embodiment, when the second section 520 and the third section 530 of the second capillary structure 502 are respectively plural in number, the plural second sections 520 are respectively curvedly extended outwards from one end (e.g., one of the second subsection 512B) of the first section 512, disposed within the inner cavity 121, and fixedly connected to the first capillary structures 400 (e.g., first plate 410 or second plate 420) which are located at different regions. The plural third sections 530 are respectively curvedly extended outwards from one end (e.g., the other of the second subsection 512B) of the first section 512, disposed within the inner cavity 121, and fixedly connected to the first capillary structures 400 (e.g., first plate 410 or second plate 420) which are located at different regions; however, the disclosure is not limited thereto. For example, the second section 520 of the second capillary structure 502 is two in the number, and the two second sections 520 are respectively connected to two opposite ends of the first section 512. Through the design of the plural second sections 520 and the plural third sections 530, temperature equalization effect of the vapor chamber 100 can be increased to improve the heat dissipation effect. In this way, when the heat sources (not shown in figures) are plural in number, and arranged at the bottom surface 123 of the case body 120 at intervals, the second sections 520 and the third sections 530 can be respectively positioned above the heat sources exactly so as to quickly receive working thermal energy from these heat sources (not shown in figures).

In one embodiment, one surface of the first segment 241 of the pipe body 240 facing towards the vapor chamber 100 is flat, but the disclosure is not limited thereto.

In the above embodiment, the first sections 510, 511, 512 of the disclosure are respectively occupied three-quarters of the corresponding pipe space 212. At this time, after the vaporized working fluid 300 is condensed back into the liquid working fluid 300, the first sections 510, 511, 512 can absorb more liquid working fluid 300 in the pipe space 212, and guide more liquid working fluid 300 to the first capillary structure 400 (e.g., the first plate 410 or the second plate 420), thereby improving the heat dissipation effect, however, the disclosure is not limited thereto.

Figure 6A:
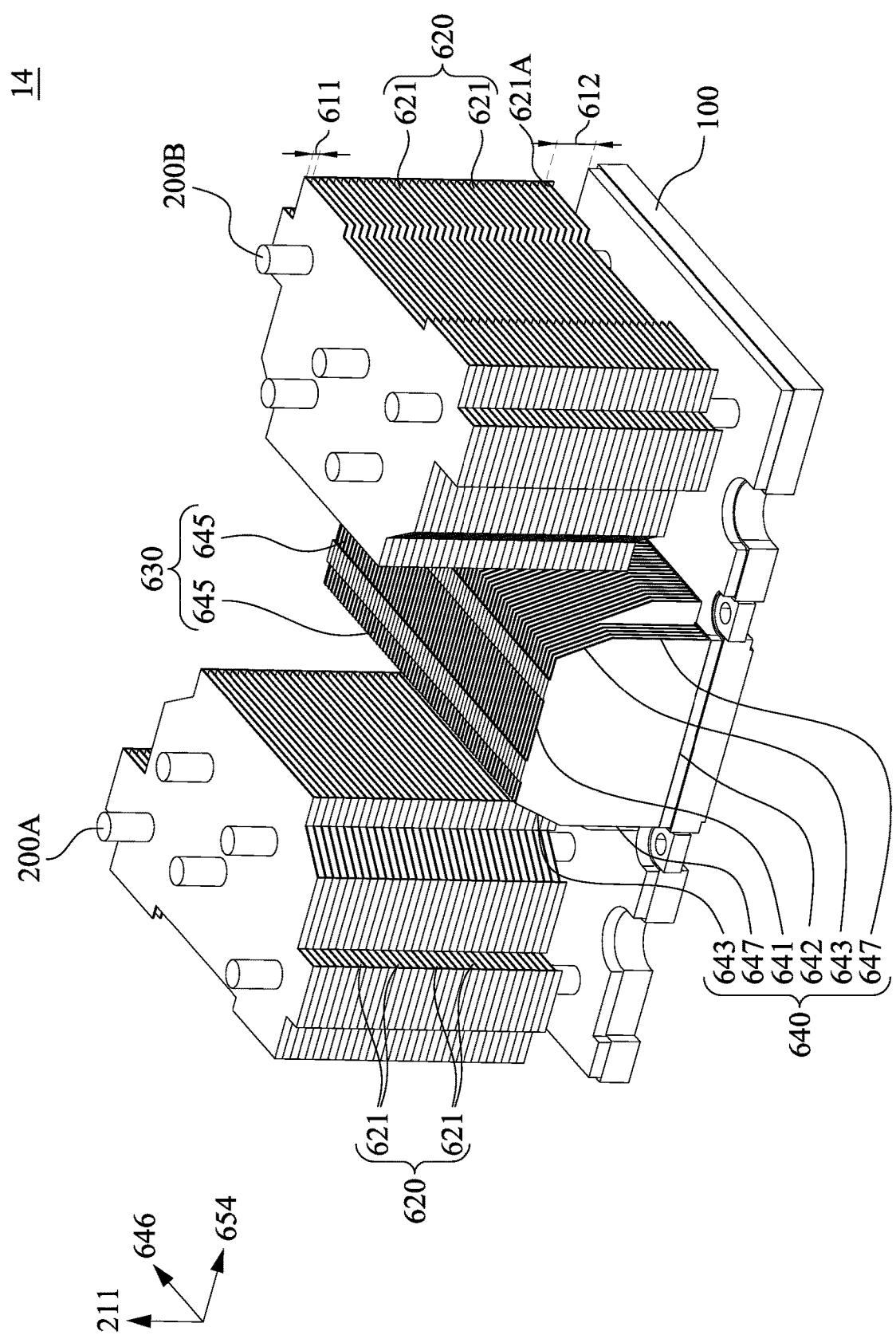
FIG. 6A is a perspective view of a three-dimensional heat dissipating device according to one embodiment of the disclosure.
Figure 6B:
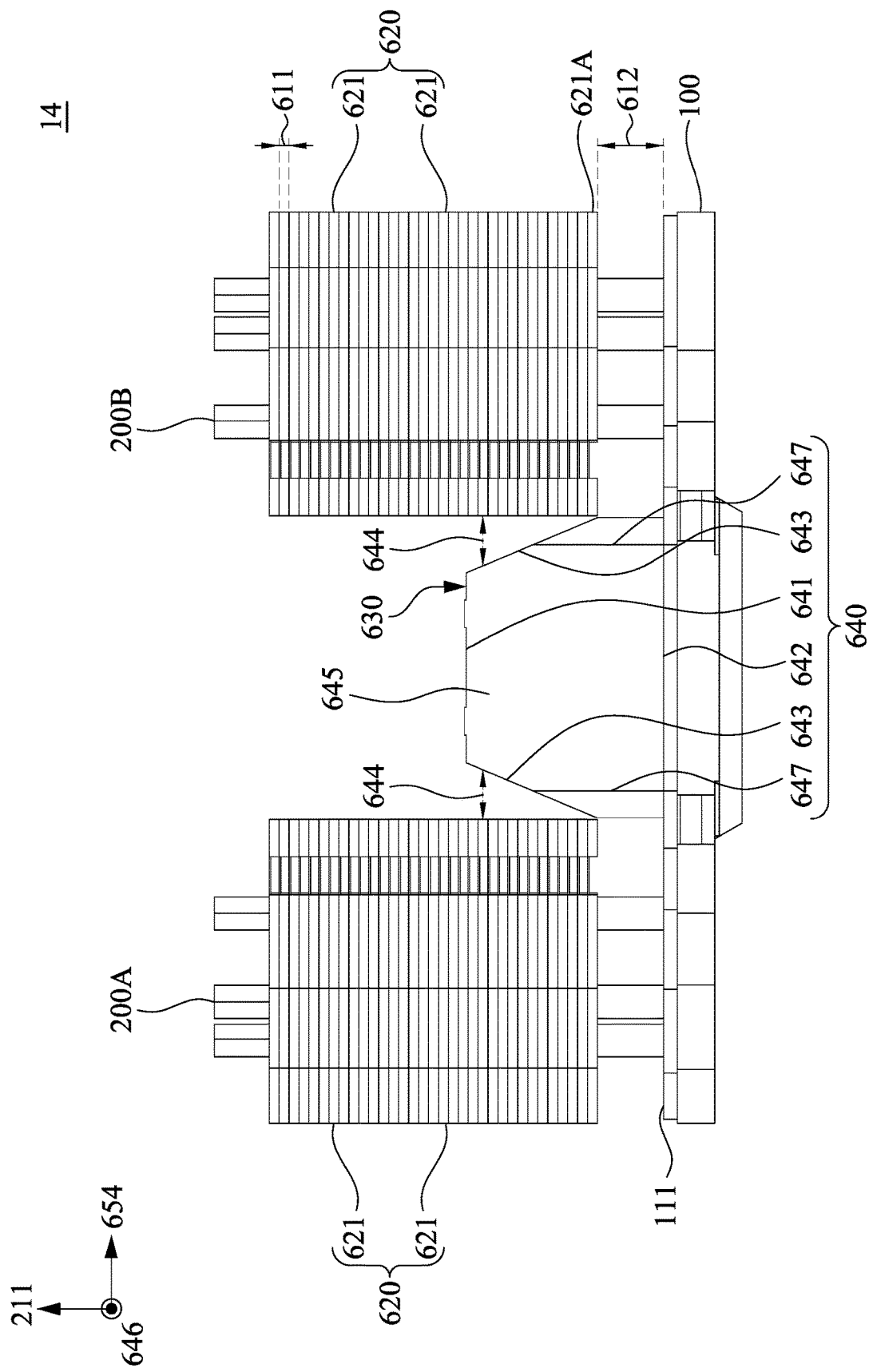
FIG. 6B is a side view of a three-dimensional heat dissipating device according to one embodiment of the disclosure.

FIG. 6A is a perspective view of a three-dimensional heat dissipating device 14 according to one embodiment of the disclosure, and FIG. 6B is a side view of a three-dimensional heat dissipating device 14 according to one embodiment of the disclosure. As shown in FIG. 6A and FIG. 6B, the three-dimensional heat dissipating device 14 of the embodiment is substantially the same to the three-dimensional heat dissipating device 11 of FIG. 3, and at least one of differences between the three-dimensional heat dissipating device 14 and the three-dimensional heat dissipating device 11 is that the three-dimensional heat dissipating device 14 further includes two first fin assemblies 620 and a second fin assembly 630. The first fin assemblies 620 are spaced arranged on the vapor chamber 100. Each of the first fin assemblies 620 includes a plurality of first heat-dissipation fins 621. The aforementioned heat pipes are divided into several first heat pipes 200A and several second heat pipes 200B. Some of the first heat-dissipation fins 621 are arranged abreast along the long axis direction 211, and vertically penetrated through by the first heat pipes 200A, simultaneously. Others of the first heat-dissipation fins 621 are arranged abreast along the long axis direction 211, and vertically penetrated through by the second heat pipes 200B, simultaneously. One of the first fin assemblies 620, the second fin assembly 630 and the other of the first fin assemblies 620 are arranged in a longitudinal direction 654 sequentially. The second fin assembly 630 includes a trapezoidal body 640 between the first fin assemblies 620. The trapezoidal body 640 includes a plurality of second heat-dissipation fins 645. The second heat-dissipation fins 645 are spaced arranged abreast along a traversal direction 646 that is orthogonal to the aforementioned long axis direction 211 and the aforementioned longitudinal direction 654.

The trapezoidal body 640 includes a top portion 641, a bottom portion 642 and two inclined portions 643 that are opposite to each other. The bottom portion 642 is opposite to the top portion 641 and fixedly connected to the vapor chamber 100. The top portion 641 is located between the inclined portions 643. A void gap 644 is formed between each of the inclined portions 643 and one adjacent of the first fin assemblies 620. Thus, when one part of the working thermal energy can be transferred to one of the first fin assemblies 620 through the first heat pipes 200A, and the other of the first fin assemblies 620 through the second heat pipes 200B, and the other part of the working thermal energy can be transferred to the second fin assembly 630 through the vapor chamber 100 so as to be dissipated into the atmosphere through the first heat-dissipation fins 621 and the second heat-dissipation fins 645. In one embodiment, a straight portion 647 of the trapezoidal body 640 is defined between the bottom portion 642 and one side of the inclined portions 643 opposite to the top portion 641. The straight portion 647 is perpendicular to the bottom portion 642. However, the disclosure is not limited thereto.

It is noted, after the working thermal energy is transferred to the second fin assembly 630, the working thermal energy further can be dissipated into the atmosphere through the void gap 644 between the inclined portion 643 and the first fin assembly 620.

Also, a first gap 611 is formed between any two adjacent ones of the first heat-dissipation fins 621, and any two of the first gap 611 are substantially the same. A second gap 612 is formed between the vapor chamber 100 and the most bottom one of the first heat-dissipation fins 621 (i.e., the first heat-dissipation fin 621A closest to the vapor chamber 100). The second gap 612 is greater than the first gap 611. Thus, after the working thermal energy is transferred to the vapor chamber 100, the working thermal energy further can be dissipated into the atmosphere through the second gap 612.

Figure 7A:
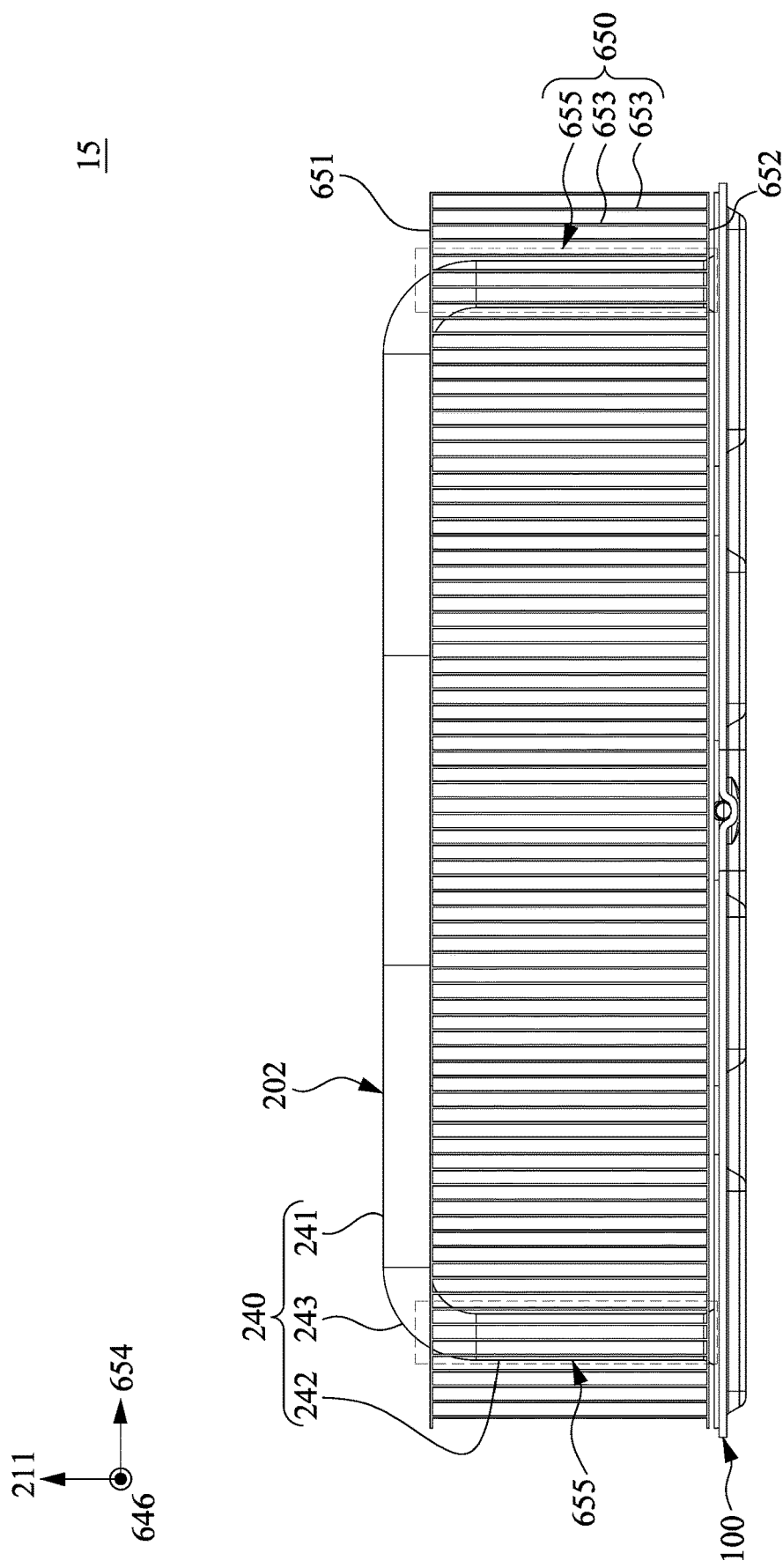
FIG. 7A is a side view of a three-dimensional heat dissipating device according to one embodiment of the disclosure.

FIG. 7A is a side view of a three-dimensional heat dissipating device 15 according to one embodiment of the disclosure. As shown in FIG. 7A, the three-dimensional heat dissipating device 15 of the embodiment is substantially the same to the three-dimensional heat dissipating device 13 of FIG. 5, and at least one of differences between the three-dimensional heat dissipating device 15 and the three-dimensional heat dissipating device 13 is that the three-dimensional heat dissipating device 15 includes a third fin assembly 650. The third fin assembly 650 includes a top portion 651 and a bottom portion 652 opposite to each other. The bottom portion 652 is connected to the vapor chamber 100. The third fin assembly 650 includes a plurality of third heat-dissipation fins 653. The third heat-dissipation fins 653 are spaced arranged abreast along a longitudinal direction 654 that is orthogonal to the aforementioned traversal direction 646 and the aforementioned long axis direction 211. The pipe body 240 of the heat pipe 202 is in a U type. One part of the pipe body 240 in the U type is disposed on the top portion 651 of the third fin assembly 650, and the other part of the pipe body 240 in the U type extends into the third heat-dissipation fins 653 from the top portion 651 of the third fin assembly 650.

More specifically, the third fin assembly 650 is provided with two penetrating channels 655. Each of the penetrating channels 655 extends along the long axis direction 211 to connect to the top portion 651 and the bottom portion 652 of the third fin assembly 650, respectively. The first segment 241 of the pipe body 240 is located outside the third heat-dissipation fins 653, and directly placed on the top portion 651 of the third fin assembly 650, and each of the second segments 242 extends into one of the penetrating channels 655 from the top portion 651 of the third fin assembly 650.

In this embodiment, a width of each of the penetrating channels 655 is approximately the same as a width of the second segment 242 of the pipe body 240, or a width of each of the penetrating channels 655 is greater than a width of the second segment 242 of the pipe body 240.

In one embodiment, one surface of the first segment 241 of the pipe body 240 facing towards the top portion 651 of the third fin assembly 650 is flat, but the disclosure is not limited thereto.

Figure 7B:
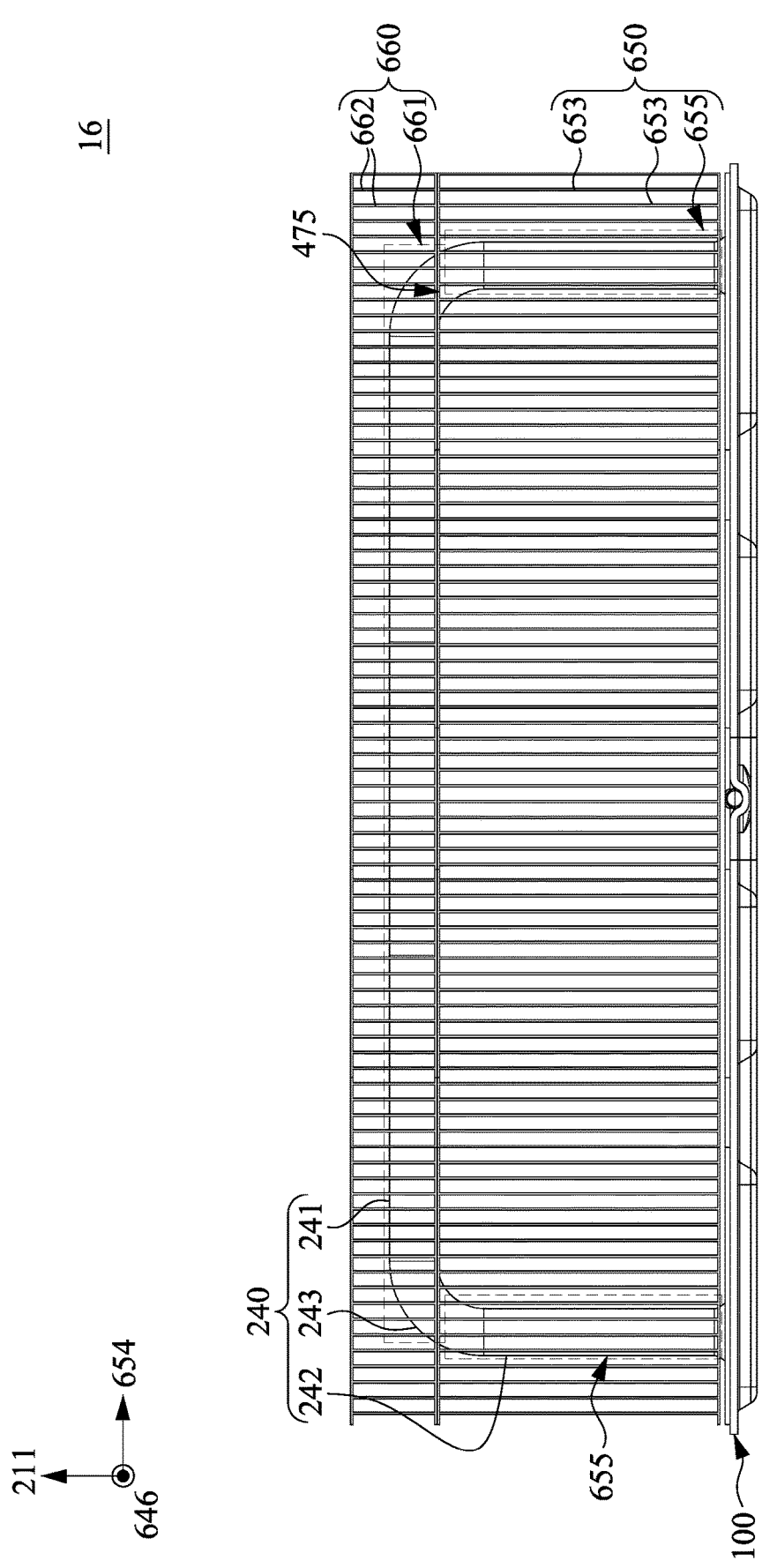
FIG. 7B is a side view of a three-dimensional heat dissipating device according to one embodiment of the disclosure.

FIG. 7B is a side view of a three-dimensional heat dissipating device 16 according to one embodiment of the disclosure. As shown in FIG. 7B, the three-dimensional heat dissipating device 16 of the embodiment is substantially the same to the three-dimensional heat dissipating device 15 of FIG. 7A, and at least one of differences between the three-dimensional heat dissipating device 16 and the three-dimensional heat dissipating device 15 is that the three-dimensional heat dissipating device 16 further includes a fourth fin assembly 660. The fourth fin assembly 660 is stacked above the third fin assembly 650. The fourth fin assembly 660 includes a plurality of fourth heat-dissipation fins 662 spaced arranged abreast along the longitudinal direction 654. One part of the pipe body 240 in the U type is disposed within the fourth fin assembly 660, and the other part of the pipe body 240 in the U type extends into the third fin assembly 650 from the fourth fin assembly 660.

More specifically, a lateral groove 661 is recessed on one surface of the fourth fin assembly 660 facing towards the third fin assembly 650. The lateral groove 661 is located between the fourth fin assembly 660 and the third fin assembly 650, and recessed on several of the fourth heat-dissipation fins 662. The first segment 241 of the pipe body 240 of the heat pipe 202 is located within the lateral groove 661, and directly placed on the third fin assembly 650. Each of the second segments 242 of the pipe body 240 extends into one of the penetrating channels 655 in the third fin assembly 650. In the embodiment, a width of the lateral groove 661 is substantially the same to a width of the first segment 241 of the pipe body 240, and a width of one of the penetrating channels 655 is substantially the same to a width of one of the second segments 242 of the pipe body 240. Alternatively, a width of the lateral groove 661 is greater than a width of the first segment 241 of the pipe body 240, and a width of one of the penetrating channels 655 is greater than a width of one of the second segments 242 of the pipe body 240.

Figure 8A:
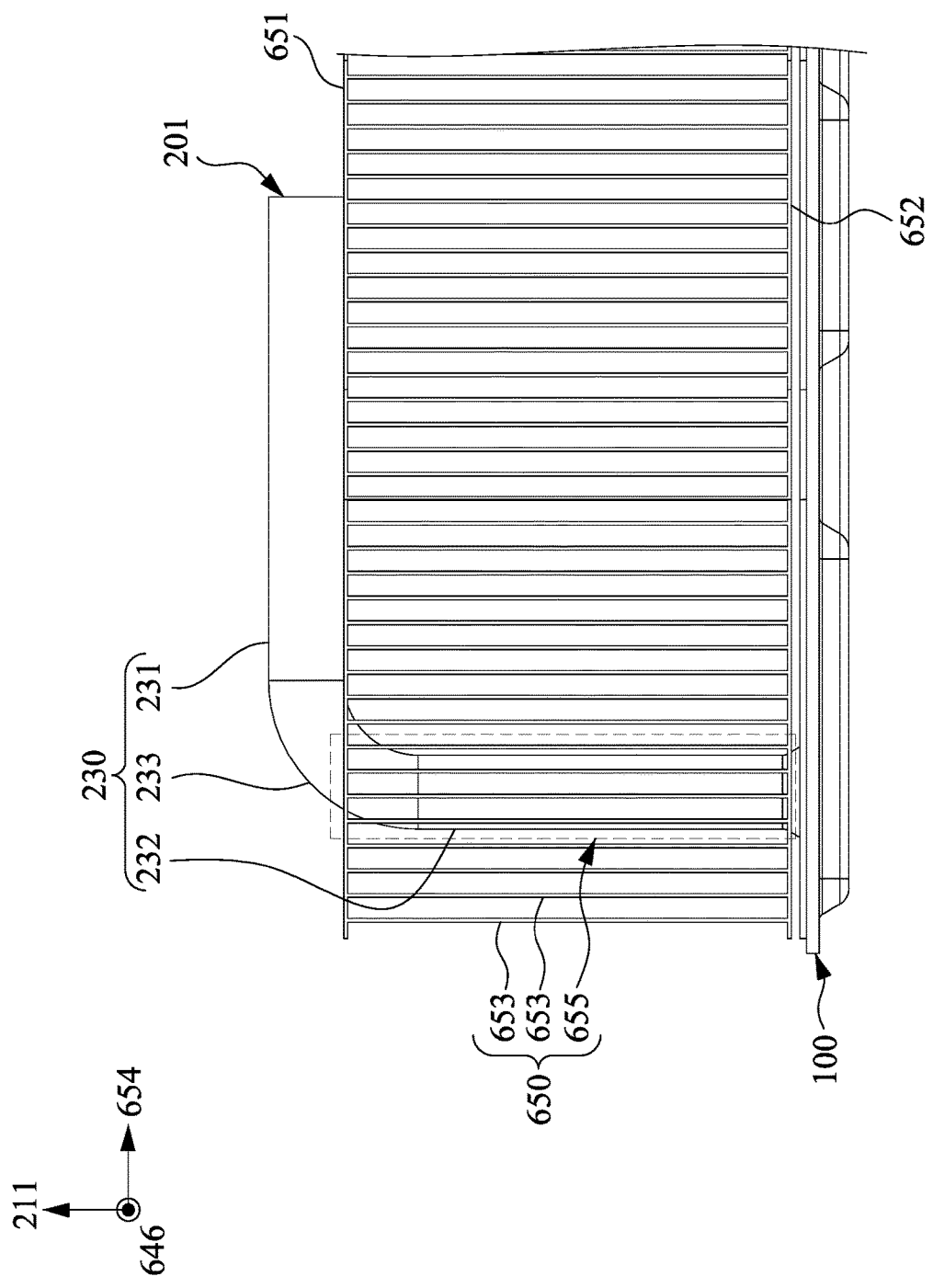
FIG. 8A is a partial side view of a three-dimensional heat dissipating device according to one embodiment of the disclosure.

FIG. 8A is a partial side view of a three-dimensional heat dissipating device 17 according to one embodiment of the disclosure. As shown in FIG. 8A, the three-dimensional heat dissipating device 17 of the embodiment is substantially the same to the three-dimensional heat dissipating device 15 of FIG. 7A, and at least one of differences between the three-dimensional heat dissipating device 17 and the three-dimensional heat dissipating device 15 is that the pipe body 230 of the heat pipe 201 is in an L type, and one part of the pipe body 230 is disposed on the top portion 651 of the third fin assembly 650, and the other part of the pipe body 230 extends into the third heat-dissipation fins 653 from the top portion 651 of the third fin assembly 650.

More specifically, the first segment 231 of the pipe body 230 with the L type is located outside the third heat-dissipation fins 653, and directly placed on the top portion 651 of the third fin assembly 650, and the second segment 232 of the pipe body 230 extends into one of the penetrating channels 655 from the top portion 651 of the third fin assembly 650. In this embodiment, a width of each of the penetrating channels 655 is approximately the same as a width of the second segment 232 of the pipe body 230, or a width of each of the penetrating channels 655 is greater than a width of the second segment 232 of the pipe body 230.

In one embodiment, one surface of the first segment 231 of the pipe body 230 facing towards the top portion 651 of the third fin assembly 650 is flat, but the disclosure is not limited thereto.

Figure 8B:
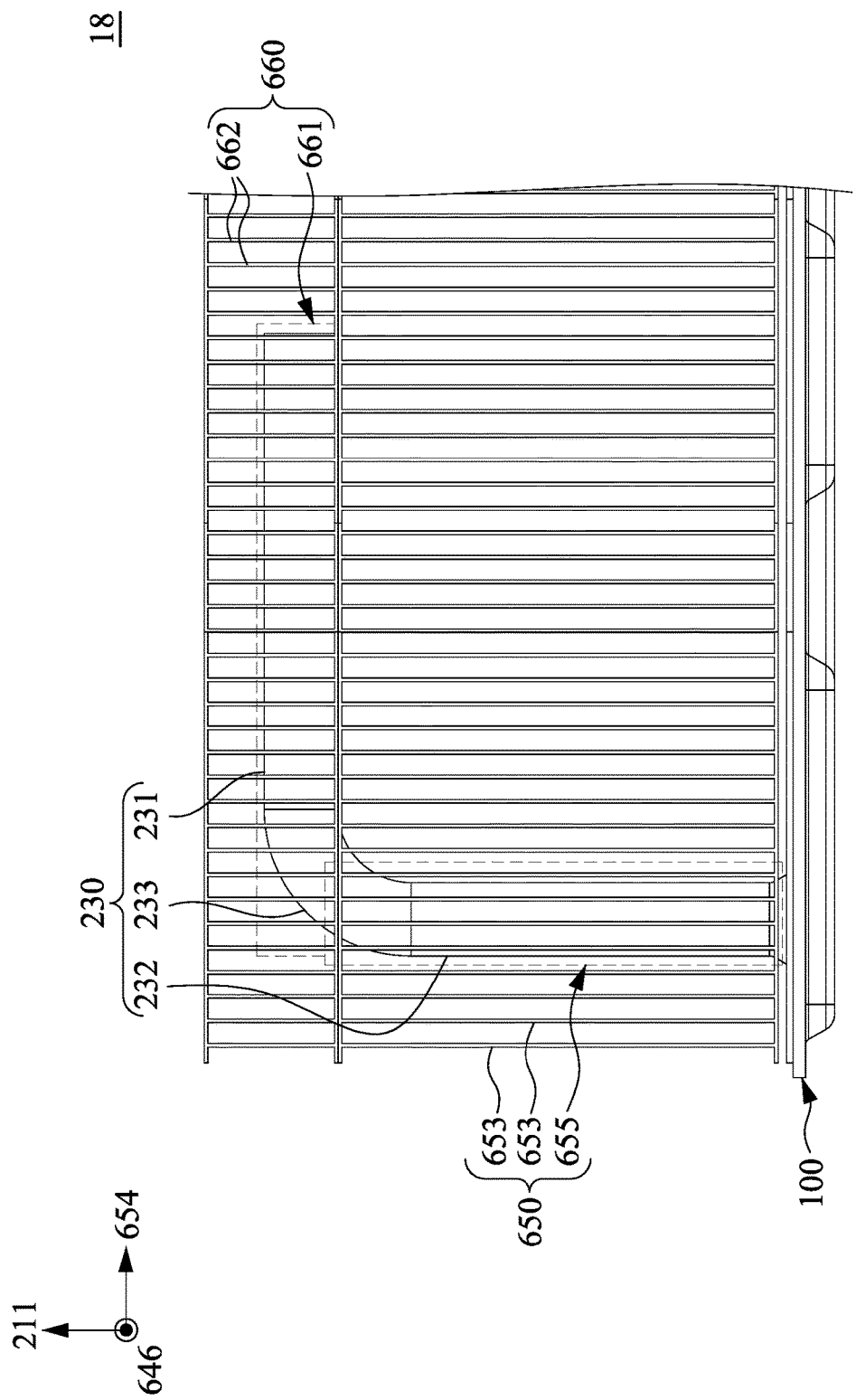
FIG. 8B is a partial side view of a three-dimensional heat dissipating device according to one embodiment of the disclosure.

FIG. 8B is a partial side view of a three-dimensional heat dissipating device 18 according to one embodiment of the disclosure. As shown in FIG. 8B, the three-dimensional heat dissipating device 18 of the embodiment is substantially the same to the three-dimensional heat dissipating device 16 of FIG. 7B, and at least one of differences between the three-dimensional heat dissipating device 18 and the three-dimensional heat dissipating device 16 is that the pipe body 230 of the heat pipe 201 is in an L type rather than a U type. The pipe body 230 in the L type is collectively disposed within the third fin assembly 650 and the fourth fin assembly 660.

More specifically, the first segment 231 of the pipe body 230 in the L type is located within the lateral groove 661, and the second segment 232 of the pipe body 230 extends into one of the penetrating channels 655 in the third fin assembly 650. In the embodiment, a width of the lateral groove 661 is substantially the same to a width of the first segment 231 of the pipe body 230, and a width of one of the penetrating channels 655 is substantially the same to a width of the second segment 232 of the pipe body 230.

To sump, in the foregoing embodiments, each of the vapor chamber and the heat pipe includes a metal material or a composite material with high conductivity. The conductivity is, for example, a thermal conductivity, however, the disclosure is not limited to thereto. The metal material is, for example, copper, aluminum, stainless steel, or heterogeneous metals, etc. However, the disclosure is not limited thereto. The working fluid is, for example, pure water, inorganic compounds, alcohols, ketones, liquid metals, refrigerant, organic compounds, or mixtures thereof, however, the present invention is not limited thereto. Each of the first capillary structure and the second capillary structure is a porous structure that is allowed to provide capillary force to drive the working fluid. For example, the capillary structure is made of powder sintered body, mesh body, fiber body, groove, whisker or any combination of the foregoing. When the capillary structure is sintered metal powders, the sintered metal powders are formed on the inner surfaces of the inner cavity. When the capillary structure is a fibrous body, the fibrous body includes fiber bundles twisted and wound by a plurality of fiber threads. The fiber thread is a metal fiber thread, a glass fiber thread, a carbon fiber thread, a polymer fiber thread, or other capillary material that is able to guide the flow of the working fluid, but the disclosure is not limited thereto.

Although the disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A three-dimensional heat dissipating device, comprising:
  a vapor chamber comprising an inner cavity and at least one first joint, and the at least one first joint formed with a passage that is in communication with the inner cavity;
  at least one heat pipe provided with a pipe space that is in communication with the inner cavity through the passage, and at least one second joint sleeving to surround the at least one first joint such that one end surface of the at least one second joint is directly contacted with one surface of the vapor chamber, wherein the at least one second joint is connected to and surrounds one end of the at least one heat pipe, and the at least one second joint gradually expands outwardly from the one end of the at least one heat pipe radially in a direction facing away from the heat pipe and the at least one first joint such that the at least one second joint surrounds to form a cone-shaped space, and a maximum diameter of the cone-shaped space is greater than a maximum diameter of the pipe space;

a working fluid filled within the pipe space and the inner cavity; and at least one solder bonding portion that is connected to the at least one second joint and the one surface of the vapor chamber for integrating the at least one heat pipe and the vapor chamber together.

2. The three-dimensional heat dissipating device of claim 1, wherein the vapor chamber comprises a cover body and a case body which are sealed to each other so as to form the inner cavity between the cover body and the case body, wherein the at least one first joint is formed on a top surface of the cover body.

3. The three-dimensional heat dissipating device of claim 1, wherein the at least one solder bonding portion surrounds a periphery of the at least one first joint, and the at least one solder bonding portion that is closely filled within a slit defined among the at least one first joint, the at least one second joint and the vapor chamber.

4. The three-dimensional heat dissipating device of claim 2, further comprising:

a first capillary structure directly located within the inner cavity for guiding a flow of the working fluid; and a second capillary structure comprising a first section and at least one second section, wherein the first section is fixedly disposed within the inner cavity, and connected to the second section, and the second section curvedly extends outwards from one end of the first section, disposed within the inner cavity, and connected to the first capillary structure for guiding the flow of the working fluid.

5. The three-dimensional heat dissipating device of claim 4, wherein the first capillary structure comprises a first plate, the first plate is directly formed on one surface of the case body facing towards the cover body, and directly sandwiched between the case body and the at least one second section of the second capillary structure.

6. The three-dimensional heat dissipating device of claim 5, wherein the first capillary structure comprises a second plate, and the second plate is directly formed on one surface of the cover body facing towards the case body; and one part of the first section of the second capillary structure is located within the inner cavity, and in contact with the first plate or the second plate of the first capillary structure.

7. The three-dimensional heat dissipating device of claim 1, further comprising:

a fin assembly comprising a plurality of heat-dissipation fins, and the heat-dissipation fins which are spaced arranged abreast and parallel to one another, and penetrated by the at least one heat pipe simultaneously.

8. The three-dimensional heat dissipating device of claim 1, wherein the at least one heat pipe is in one of a linear shape, an L-type and a U-type.

9. The three-dimensional heat dissipating device of claim 1, further comprising:

two first fin assemblies spaced arranged on the vapor chamber, each of the first fin assemblies comprising a plurality of first heat-dissipation fins, wherein the at least one heat pipe is plural, and each of the heat pipes is provided with a long axis direction that is perpendicularly passed through a top surface of the vapor chamber, the first heat-dissipation fins are spaced arranged abreast along the long axis direction, and the heat pipes comprise at least one first heat pipe and at least one second heat pipe, the first heat-dissipation fins of one of the two first fin assemblies are vertically penetrated through by the at least one first heat pipe simultaneously, and the first heat-dissipation fins of the other of the two first fin assemblies are vertically penetrated through by the at least one second heat pipe simultaneously; and a second fin assembly comprising a trapezoidal body between the two first fin assemblies, and the trapezoidal body comprising a plurality of second heat-dissipation fins, and the second heat-dissipation fins are spaced arranged abreast on the vapor chamber along a traversal direction orthogonal to the long axis direction, wherein the trapezoidal body comprises a top portion, a bottom portion, and two inclined portions that are opposite to each other, the bottom portion is opposite to the top portion and fixedly connected to the vapor chamber, the top portion is located between the inclined portions, a void gap is formed between each of the two inclined portions and one adjacent of the two first fin assemblies.

10. The three-dimensional heat dissipating device of claim 9, wherein a first gap is formed between any two adjacent ones of the first heat-dissipation fins, and a second gap is formed between the vapor chamber and one of the first heat-dissipation fins being adjacent to the vapor chamber, wherein the second gap is greater than the first gap.

11. The three-dimensional heat dissipating device of claim 4, wherein the at least one first joint is two in number; the at least one heat pipe is one in number, the at least one second joint is two in number, and the second joints are located at two opposite ends of the at least one heat pipe, wherein each of the second joints of the at least one heat pipe is respectively sleeved to surround the corresponding one of the first joints; and the at least one second section of the second capillary structure is two in number, the at least one second section are connected to two opposite ends of the first section, respectively, wherein the second sections are respectively connected to the first capillary structure in the inner cavity.

12. The three-dimensional heat dissipating device of claim 1, further comprising:

a third fin assembly comprising a top portion and a bottom portion being opposite to each other, the bottom portion that is connected to the top surface of the vapor chamber, the third fin assembly comprising a plurality of third heat-dissipation fins, the third heat-dissipation fins that are spaced arranged abreast along a longitudinal direction orthogonal to a normal direction of the top surface of the vapor chamber, wherein the at least one heat pipe is in a U type, and one part of the at least one heat pipe is disposed on the top portion of the third fin assembly, and the other part of the at least one heat pipe extends into the third heat-dissipation fins from the top portion of the third fin assembly.

13. The three-dimensional heat dissipating device of claim 1, further comprising:

a third fin assembly disposed on the vapor chamber, comprising a plurality of third heat-dissipation fins spaced arranged abreast along a longitudinal direction orthogonal to a normal direction of the top surface of the vapor chamber; and a fourth fin assembly stacked on the third fin assembly, and comprising a plurality of fourth heat-dissipation fins spaced arranged abreast along the longitudinal direction, wherein the at least one heat pipe is in a U type, and disposed within the third fin assembly and the fourth fin assembly.

14. The three-dimensional heat dissipating device of claim 1, further comprising:
a third fin assembly comprising a top portion and a bottom portion being opposite to each other, the bottom portion that is connected to the top surface of the vapor chamber,
the third fin assembly comprising a plurality of third heat-dissipation fins, the third heat-dissipation fins that are spaced arranged abreast along a longitudinal direction orthogonal to a normal direction of the top surface of the vapor chamber,
wherein the at least one heat pipe is in an L type, and one part of the at least one heat pipe is disposed on the top portion of the third fin assembly, and the other part of the at least one heat pipe extends into the third heat-dissipation fins from the top portion of the third fin assembly.

15. The three-dimensional heat dissipating device of claim 1, further comprising:
a third fin assembly disposed on the vapor chamber, comprising a plurality of third heat-dissipation fins spaced arranged abreast along a longitudinal direction orthogonal to a normal direction of the top surface of the vapor chamber; and
a fourth fin assembly stacked on the third fin assembly, and comprising a plurality of fourth heat-dissipation fins spaced arranged abreast along the longitudinal direction,
wherein the at least one heat pipe is in an L type, and disposed within the third fin assembly and the fourth fin assembly.

* * * * *